(12) United States Patent  
Suguro

(10) Patent No.: US 6,730,581 B2  
(45) Date of Patent: May 4, 2004

(54) SEMICONDUCTOR DEVICE AND METHOD OF MANUFACTURE THEREOF

(75) Inventor: Kyoichi Suguro, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 40 days.

(21) Appl. No.: 09/877,136

(22) Filed: Jun. 11, 2001

(65) Prior Publication Data

US 2001/0039107 A1 Nov. 8, 2001

Related U.S. Application Data

(62) Division of application No. 09/199,424, filed on Nov. 25, 1998.

(51) Int. Cl.[7] ............................................... H01L 21/20
(52) U.S. Cl. ..................... 438/486; 438/653; 438/253
(58) Field of Search ............................. 438/585, 486, 438/488, 509, 255, 398, 253, 396, 254, 592, 653, 659, 301, 296, 576; 257/407, 388

(56) References Cited

U.S. PATENT DOCUMENTS

| 4,804,636 | A | * | 2/1989 | Groover et al. ............ 438/275 |
| 5,104,515 | A | * | 4/1992 | Chu et al. .................... 208/46 |
| 5,192,714 | A | * | 3/1993 | Suguro et al. .............. 438/631 |
| 5,229,631 | A | * | 7/1993 | Woo ............................ 257/314 |
| 5,304,510 | A | * | 4/1994 | Suguro et al. .............. 438/624 |
| 5,403,762 | A | * | 4/1995 | Takemura ................... 438/164 |
| 5,565,702 | A | * | 10/1996 | Tamura et al. ............. 257/530 |
| 5,612,236 | A | * | 3/1997 | Mikata et al. .............. 438/198 |
| 5,886,391 | A | * | 3/1999 | Niroomand et al. ....... 257/510 |
| 5,903,053 | A | * | 5/1999 | Iijima et al. ................ 257/751 |
| 5,960,319 | A | * | 9/1999 | Iwata et al. ................ 438/664 |
| 5,990,556 | A | * | 11/1999 | Mizobuchi et al. ........ 257/750 |
| 6,054,355 | A | * | 4/2000 | Inumiya et al. ............ 438/296 |
| 6,062,869 | A | * | 5/2000 | Mizobuchi et al. ........ 438/225 |
| 6,096,641 | A | * | 8/2000 | Kunikiyo .................... 438/653 |
| 6,228,740 | B1 | * | 5/2001 | Niroomand et al. ....... 438/398 |
| 6,238,986 | B1 | * | 5/2001 | Kepler et al. .............. 438/301 |
| 6,251,763 | B1 | * | 6/2001 | Inumiya et al. ............ 438/595 |
| 6,271,133 | B1 | * | 8/2001 | Lim et al. ................... 438/683 |
| 6,271,573 | B1 | * | 8/2001 | Suguro ....................... 257/407 |
| 6,294,442 | B1 | * | 9/2001 | Kamal ........................ 438/486 |
| 6,303,962 | B1 | * | 10/2001 | Gardner et al. ............ 257/347 |
| 6,306,743 | B1 | * | 10/2001 | Lee ............................. 438/592 |
| 6,426,532 | B1 | * | 7/2002 | Iwata et al. ................ 257/374 |
| 6,458,652 | B1 | * | 10/2002 | Chen et al. ................. 438/253 |
| 6,465,335 | B1 | * | 10/2002 | Kunikiyo .................... 438/592 |

FOREIGN PATENT DOCUMENTS

| JP | 56-157066 | 12/1981 |
| JP | 8-139092 | 5/1996 |

OTHER PUBLICATIONS

English Language Derwent Abstract of JP 56–157066.
English Language Japio Abstract of JP 56–157066.

* cited by examiner

Primary Examiner—Carl Whitehead, Jr.
Assistant Examiner—Laura M Schillinger
(74) Attorney, Agent, or Firm—Finnegan, Henderson, Farabow, Garrett & Dunner, L.L.P.

(57) ABSTRACT

Variations in threshold voltage among MOS devices are prevented by forming a metal gate electrode having an average grain size of 30 nm or less on a gate insulating film.

5 Claims, 7 Drawing Sheets

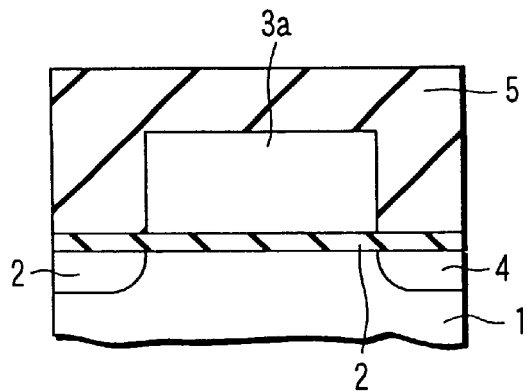
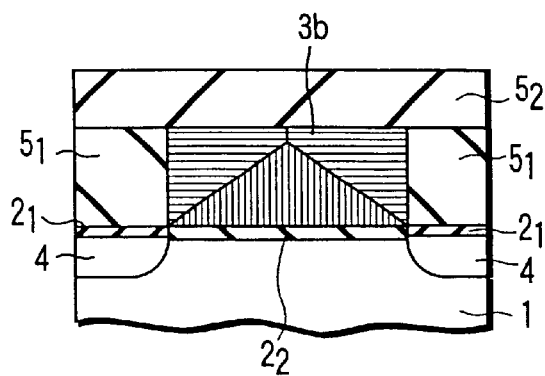
FIG. 5  FIG. 6
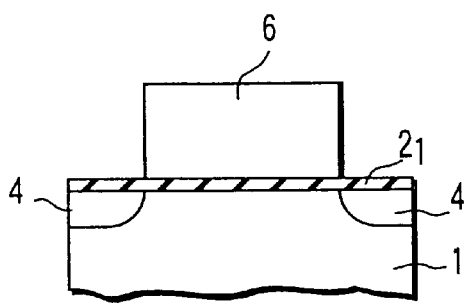
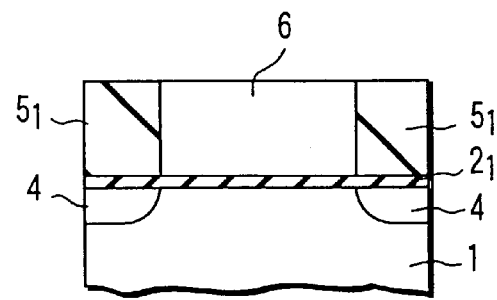
FIG. 7A  FIG. 7B
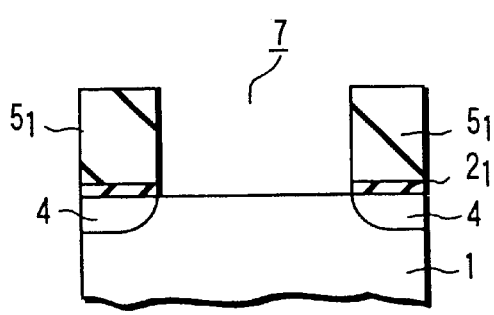
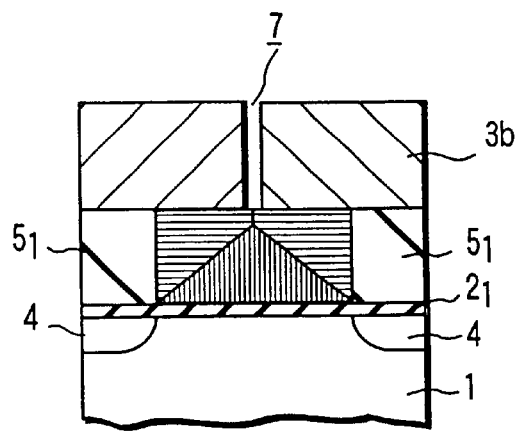
FIG. 7C  FIG. 7D

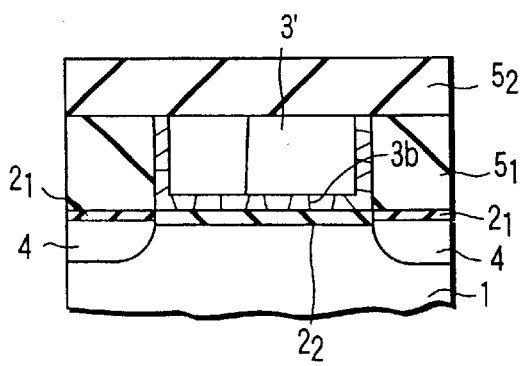
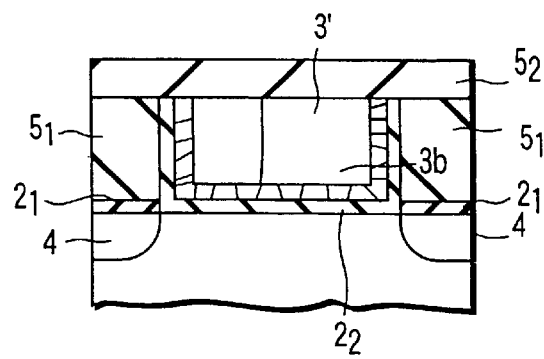
FIG. 8  FIG. 9
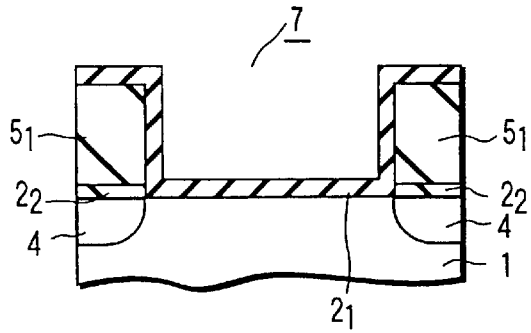
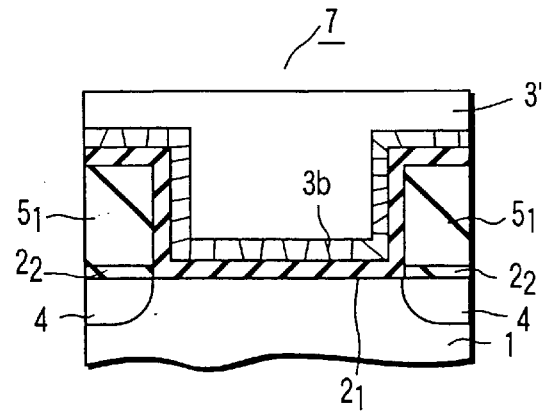
FIG. 10A  FIG. 10B
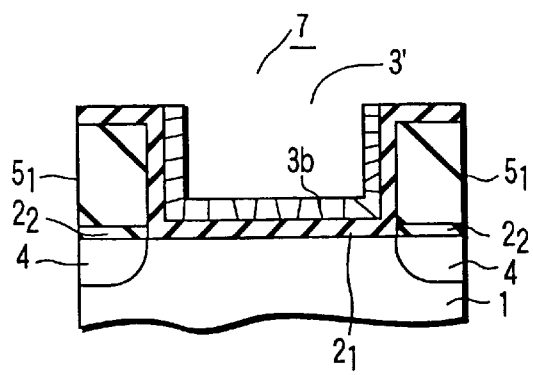
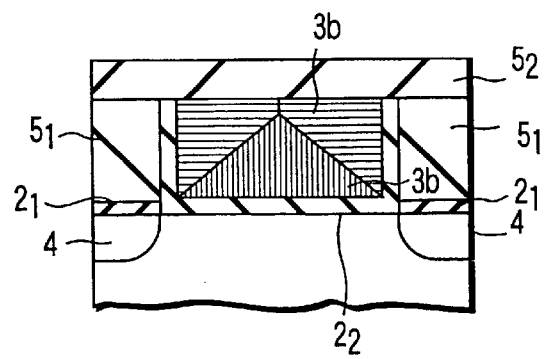
FIG. 10C  FIG. 11

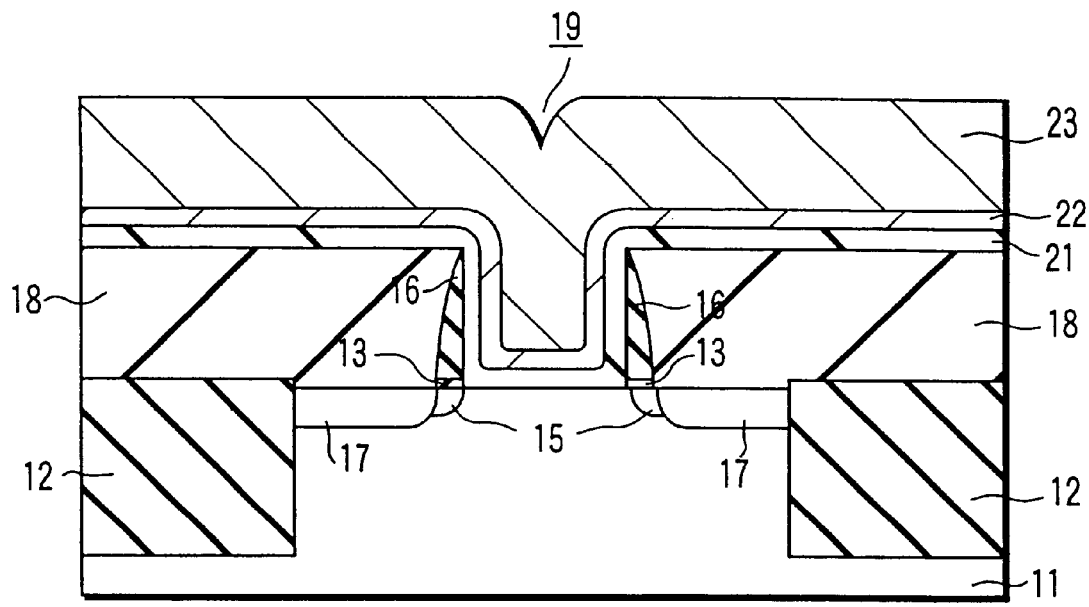
F I G. 12G
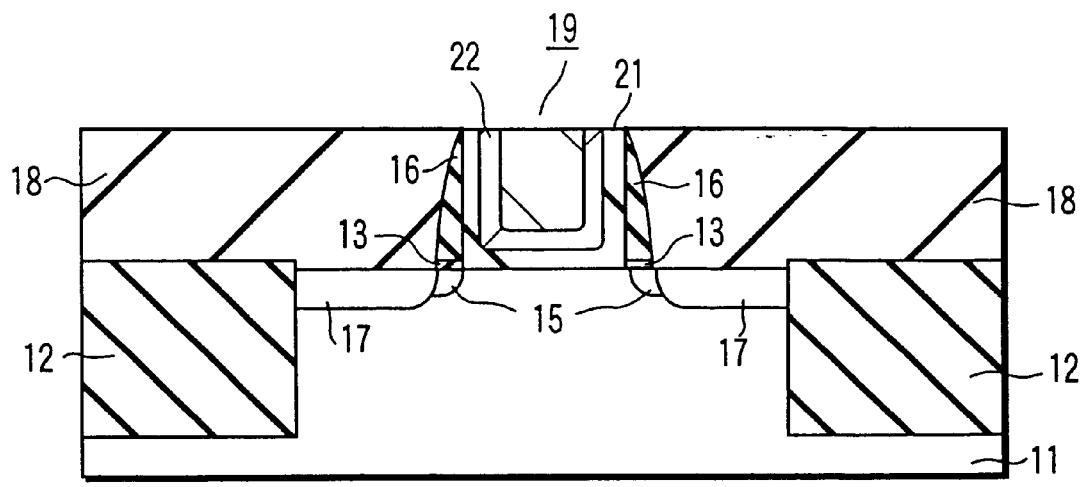
F I G. 12H

SEMICONDUCTOR DEVICE AND METHOD OF MANUFACTURE THEREOF

This is a division of application Ser. No. 09/199,424, filed Nov. 25,1998; which has been allowed, and is incorporated herein by reference.

BACKGROUND OF THE INVENTION

The present invention relates to a MOS device, such as a MOS transistor or a MOS capacitor, and more specifically to a semiconductor device containing MOS devices having their respective gate electrodes made of a metal or metal compound and a method of manufacture thereof.

In recent years, as a key component of computers and communications equipment use is extensively made of a large-scale integrated circuit or circuits (LSI circuits) in which a very large number of transistors and resistors are integrated into a single chip so that they are interconnected to implement electronic circuitry. For this reason, the performance of the whole equipment depends largely on the performance of the LSI circuit. The performance of the LSI circuit can be upgraded by increasing the packing density, namely, scaling down the dimensions of the MOS devices (microstructuring of the MOS devices).

For example, in the case of MOS transistors, the microstructuring of devices can be realized by reducing the gate length and making source/drain diffusion layers small in thickness.

As a method of forming shallow source/drain diffusion layers, low-acceleration ion implantation is widely used, by which source/drain diffusion layers having a thickness of less than 0.1 $\mu$m can be formed.

However, the source/drain diffusion layers formed by the low-acceleration ion implantation have a high sheet resistance as high as 100$\Omega$/□. Thus, an increase in the speed of circuit operation owing to microstructuring cannot be expected without modification.

With devices having high speed requirements, such as logic LSI circuits, the salicidation technology is used by which a silicide film is formed on source/drain diffusion layers and the top of the gate electrode made of a polycrystalline silicon (hereinafter referred to as polysilicon) film doped with impurities using a self-aligned process.

In the formation of dual-gate MOS transistors (n-channel and p-channel MOS transistors formed in the same substrate: the n-channel transistor has a gate electrode made of n-type doped polysilicon and the n-channel transistor has a gate electrode made of p-type doped polysilicon), the salicidation technology can effect not only a reduction in the resistance of gate electrodes but also a decrease in the number of manufacturing steps.

The reason is that, in the ion implantation step of forming source/drain diffused regions, the gate can be doped with impurities of given conductivity type.

In contrast, in the formation of dual-gate MOS transistors having a polycide (polysilicon-silicide) gate electrode in which a metallic silicide film is formed onto a polysilicon film doped with impurities, the polysilicon film cannot be doped with impurities of given conductivity type in the ion implantation step for forming source/drain regions because it is masked by the metallic silicide film.

Therefore, prior to the formation of source/drain regions it is required to dope the polysilicon film with impurities of given conductivity type. That is, the ion implantation step for forming the source/drain regions and the ion implantation step for doping the polysilicon film with impurities have to be carried out separately, increasing the number of steps.

To be specific, in comparison with the salicide process, the polycide process requires two additional steps for each of photolithography, ion implantation, and resist stripping.

On the other hand, with devices that require devices to be packed as closely as possible as in memory LSI circuits such as DRAMs, it is essential to adopt SAC (Self-Aligned Contact) structures.

The formation of the SAC structure involves a step of etching an interlayer insulating film on one of the source/drain diffusion layers (usually one used as the source) by means of RIE (Reactive Ion Etching) to form a contact hole to the source/drain diffusion layer.

At this point, even if the contact hole is misaligned, it is required not to expose the top of the polysilicon gate electrode. To this end, a silicon nitride film is formed in advance on the gate electrode as an etching stopper film.

The presence of such a silicon nitride film will not allow impurities to be introduced into the gate electrode in the ion implantation step for the formation of the source/drain regions. For this reason, unlike the logic LSI, in the memory LSI, the salicidation technology cannot be used.

Heretofore, gate electrodes made of impurity-doped polysilicon (polysilicon gate electrodes) have been widely used. In addition, the polycide gate electrodes have also been used to comply with low-resistivity requirements.

Where gate electrodes of much lower resistivity are required, a poly-metal gate electrode structure is used in which an impurity-doped polysilicon film, a barrier metal film and a tungsten (W) film are stacked in sequence. The poly-metal gate electrode, which is lower in resistivity than the polycide gate electrode, can implement a desired sheet resistance with reduced film thickness.

However, the poly-metal electrode has the following problem: As described previously, the dual-gate structure is used in logic LSI circuits. As with the use of the polycide gate structure, the use of the poly-metal gate electrode structure in logic LSI circuits requires two separate steps: a step of ion implanting impurities into the polysilicon film of the poly-metal gate electrode, and a step of ion implanting impurities into the silicon substrate to form the source/drain regions. This thus results in an increase in the number of steps and an increased in manufacturing cost.

In an LSI circuit having a logic IC and a DRAM built in, the formation of a silicide film onto the top of the source/drain diffusion layers in the DRAM results in an increase in the current leakage in pn junctions of memory cells, degrading the data holding property of the cells. In the DRAM, which requires the SAC structure as described previously, a W polycide electrode is used.

On the other hand, for the DRAM to allow as much current as possible to flow with a low voltage, it is required to lower the threshold voltage of MOS transistors. To this end, it is required to dope the polysilicon film in the gate electrodes of n-channel MOS transistors with n-type impurities such as phosphorous (P) or arsenic (As) and dope that of p-channel MOS transistors with p-type impurities such as boron (B).

Here, in the DRAM, the thermal budget (determined by time and temperature) after the formation of the gate electrodes is great. Therefore, the use of the polysilicon films doped with such impurities for gate electrodes (polycide gate electrodes) poses two problems in the thermal process subsequent to the formation of the gate electrodes.

The first problem results from that, in the thermal process subsequent to the formation of the gate electrodes, the impurities, such as P or As, doped into the polysilicon film diffuse outward into the W silicide film and results in a decrease in the impurity concentration in the polysilicon film.

When the impurity concentration in the polysilicon film is decreased, the depletion layer spreads into the gate electrode when it is impressed with a gate voltage. As a result, the actual gate capacitance becomes smaller than the gate capacitance defined by the gate insulating film by the amount corresponding to the depletion layer. That is, the first problem is that the threshold voltage of the MOS transistors deviates from the designed value.

The second problem results from that, in the thermal process subsequent to the formation of the gate electrodes, the impurities, such as B, penetrate through the gate oxide into the silicon substrate.

The penetration of B through the gate oxide into the silicon substrate results in a change in the distribution of impurity concentration in the channel region. In this case as well, the problem arises in that the threshold voltage deviates from the designed value.

The penetration of B (inward diffusion of B) is promoted by doping the gate oxide with fluorine (F) or hydrogen (H) but controlled by doping the gate oxide with nitrogen (N). The reason why the penetration of is controlled by doping of N is that strong B—N bonds are formed at the interface of the polysilicon film and the gate oxide. However, the effect of controlling the penetration of B by doping of B was poor.

To summarize, since the MOS transistors in the memory LSI circuit and the MOS transistors in the logic LSI circuit have different requirements, there are a problem that a common gate electrode-structure cannot be used in the memory LSI circuit and the logic LSI circuit and a problem that depletion occurs in the polycide gate electrodes or poly-metal gate electrodes, especially in the memory LSI circuit, or the threshold voltage varies due to diffusion of impurities (i.e., the threshold voltage varies from device to device).

BRIEF SUMMARY OF THE INVENTION

It is an object of the present invention to provide a semiconductor device which comprises MOS devices each having its gate electrode made of a metal or metallic compound that permits variations in device characteristics to be controlled and a method of manufacture thereof.

To attain the object, a semiconductor device of the present invention comprises: a semiconductor region; a gate insulating film formed on the surface of the semiconductor region; and a first gate electrode formed on the gate insulating film and containing a metal in its portion that contacts the gate insulating film, the average grain size in the portion of the first gate electrode being 30 nm or less.

When the grain size is 0 nm, the portion of the gate electrode that contacts the gate insulating film is amorphous. When the grain size is larger than 0 nm and smaller than 30 nm, the portion is microcrystalline. In the present invention, a crystal particle size 0 nm is defined as an amorphous one.

The semiconductor region is, for example, a silicon substrate or a semiconductor layer formed on the silicon substrate.

A second gate electrode may be formed on the first gate electrode, which is lower in resistivity than and larger in grain size than the first gate electrode.

The first gate electrode is, for example, the gate electrode of a MOS transistor or a MOS capacitor.

The portion of the first gate electrode that contacts the gate insulating film is made of at least one of nitride, carbon nitride, silicon nitride of transition metal elements in IV group, silicon nitride of transition metal elements in V group, silicon and nitride of transition metal elements in VI group.

Specifically, the portion of the first gate electrode that contacts the gate insulating film is made of at least one of W nitride, Mo nitride, Ta nitride, Ti nitride, W silicon nitride, Mo silicon nitride, Ta silicon nitride, Ti silicon nitride, Ti carbon nitride, W carbon nitride, Mo carbon nitride, and Ta carbon nitride.

Moreover, the portion of the first gate electrode that contacts the gate insulating film may be made of at least one of oxygen-containing Ru, nitrogen-containing Ru, and nitrogen-containing $RuO_2$. Furthermore, the portion may be made of oxygen- or nitrogen-containing Pt or Ir or nitrogen-containing $Ir_2O_3$.

A semiconductor device manufacturing method of the present invention comprises the steps of: forming a first gate insulating film on the surface of a semiconductor substrate; forming a dummy gate electrode pattern on the first gate insulating film; forming an interlayer insulating film on the semiconductor substrate so as to cover the dummy gate electrode pattern; processing the surface of the interlayer insulating film until the dummy gate electrode pattern is exposed; removing the dummy gate electrode pattern and the underlying first gate insulating film to thereby form an opening in the interlayer insulating film; forming a second gate insulating film on the exposed surface of the semiconductor substrate on the bottom and on the sidewall of the opening; forming a first gate electrode on the second gate insulating film within the opening so that space is left inside the opening, the first gate electrode containing a metal and having an average grain size of 30 nm or less; forming, on the surface, a conductive film lower in resistivity than and larger in average grain size than the first gate electrode so as to fill in the space within the opening; and removing the conductive film outside the opening to thereby form a second gate electrode consisting of the conductive film within the opening.

Here, it is preferable to remove the conductive film outside the opening by either mechanical/chemical polishing or mechanical polishing.

In addition, it is preferable to carry out steps after the formation of the first and second gate electrodes at temperatures of 750° C. or below.

Our studies have made clear that, with the use of a gate electrode in which its portion that contacts the gate insulating film contains a metal and the average grain size is 30 nm or less, variations in threshold voltage of MOS transistors and variations in capacitance of MOS capacitors can be prevented. For example, variations in threshold voltage could be reduced to one seventh or less of the conventional value.

Since the average grain size is 30 nm or less, the stress in the film can be reduced (for example, 500 MPa or less). Thus, the hot-electron resistance can be reduced and the device reliability can be increased.

The use of the materials according to the present invention permits a gate electrode to be formed easily, in which its portion that contacts the gate insulating film contains a metal and has an average grain size of 30 nm or less. Thus, MOS devices that have the above-described characteristics can be implemented with ease.

According to the manufacturing method of the present invention using a dummy gate-electrode pattern, the accuracy of the gate length is determined by the accuracy of the dummy gate electrode pattern. Since the dummy gate electrode pattern is not used as an actual gate electrode, it can be made of impurity-free silicon or silicon oxide. These silicon-based materials can be processed by RIE more accurately than metals. Therefore, the accuracy of the gate length can be improved and variations in gate length can be reduced (e.g., 20 nm) through the use of such a material.

By removing the conductive film outside the opening by means of mechanical/chemical polishing or mechanical polishing, the dimension of the second gate electrode in the direction of height can be controlled with accuracy, reducing variations in the dimension in the direction of height.

By carrying out processes after the formation of the first and second gate electrodes at temperatures of 750° C. or below, it was found that the degradation of device characteristics can be prevented effectively.

In order to achieve this advantage for MOS transistors, it is recommended to form source/drain diffusion layers using the dummy gate electrode pattern as a mask and then form the first and second gate electrodes.

By so doing, it becomes possible to prevent an increase in gate leak current and an increase in variations in threshold voltage which are due to the source/drain formation process that involves a process temperature above 750° C.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross-sectional view of a MOS transistor using a metal gate electrode according to a fourth embodiment of the present invention;

FIG. 6 is a cross-sectional view of a MOS transistor using a metal gate electrode according to a fifth embodiment of the present invention;

FIGS. 7A through 7D are cross-sectional views, in the order of steps of manufacture, of the MOS transistor shown in FIG. 5;

FIG. 8 is a cross-sectional view of a MOS transistor using a metal gate electrode according to a sixth embodiment of the present invention;

FIG. 9 is a cross-sectional view of a MOS transistor using a metal gate electrode according to a seventh embodiment of the present invention;

FIGS. 10A, 10B and 10C cross-sectional views, in the order of steps of manufacture, of the MOS transistor shown in FIG. 8;

FIG. 11 is a cross-sectional view of a MOS transistor using a metal gate electrode according to an eighth embodiment of the present invention;

FIGS. 12A through 12H are cross-sectional views, in the order of steps of manufacture, of a MOS transistor according to a ninth embodiment of the present invention;

DETAILED DESCRIPTION OF THE INVENTION

Figure 1:
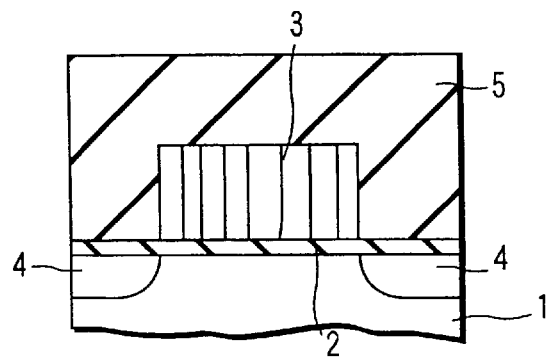
FIG. 1 is a cross-sectional view of a MOS transistor using a metal gate electrode according to a first embodiment of the present invention.

The above-described problem of inability for the memory LSI circuit and the logic LSI circuit to use a common gate structure and the problem of variations in threshold voltage associated with the poly-metal gate electrodes are soluble with the use of a gate electrode made of a metal film. such as a tungsten film, i.e., a metal gate electrode.

However, I have found that the metal gate electrode has the following problems.

A metal film is usually deposited by sputtering, CVD (chemical vapor deposition), vacuum evaporation, or plating. The resulting metal film is generally polycrystalline. Thus, the gate oxide film will come into contact with a metal gate electrode that has a plurality of crystal orientations.

Here, since a metallic crystal has work functions that differ with crystal orientations, the metal gate electrode would have a plurality of work functions. On the other hand, the threshold voltage of a MOS transistor is affected by the work function of the gate electrode. Therefore, the metal gate electrode having a plurality of work functions is not practical for the gate electrode of a MOS transistor because it causes instability in the operation of the MOS transistor.

When, for example, tungsten (W), molybdenum (Mo), and silver (Ag) are used for metal gate electrode, it is shown from Table below that, depending on the plane orientation, more than 0.2 eV of difference is produced between work functions.

TABLE

|  |  | Work function | | |
| --- | --- | --- | --- | --- |
| Metal | Crystal structure | (110) plane | (100) plane | (111) plane |
| W | bcc | 5.25 eV | 4.63 eV | 4.47 eV |
| Mo | bcc | 4.95 eV | 4.53 eV | 4.36 eV |
| Ag | fcc | 4.52 eV | 4.64 eV | 4.74 eV |

My studies have made clear that, when the gate length is set to 0.15 µm or less in MOS transistors using a W metal gate electrode, their threshold voltage varies by 0.2V or more, and this variation is due to the dependence of the work function of the W film as gate electrode on the plane orientation.

In general, the crystal grain size of metal is around 0.1 µm. In the case of a gate length of 0.15 µm or less, therefore, the gate metal film will contain only one or two crystal grains.

The plane orientation of crystal grains in a metal film is not uniquely determined by factors of the material and irregularities of a film underlying the metal film, the method of depositing the metal film, etc.

The variations in threshold voltage in the case where the gate length is set short seem to be due to, in addition to variations in work function, poor processing accuracy for gate electrode, insufficient shallowness of source/drain regions with respect to a desired gate length, and insufficient recovery from plasma-induced damage in steps of RIE (reactive ion etching), resist stripping, and ion implantation. When we changed intentionally the crystal orientations in a gate electrode, a change was made in threshold voltage. It has therefore been made clear that the metal crystal orientations have the greatest influence.

In addition, the problem of unavailability of a common gate structure in the memory and logic LSI circuits and the problem of variations in threshold voltage associated with the poly-metal gate electrodes are also soluble with the use of a metal gate electrode formed by sputtering a W film onto a sputtered TiN film (see Symposium on VLSI Technology Digest Technical Papers p. 119–120 (1955)).

However, we have found that this type of metal gate electrode has the following problems.

According to my experiments, as with pure metal, in TiN, the work function had the crystal orientation dependence, and, with the gate length set to 0.15 $\mu$m, the threshold voltage for a TiN film in the (111) plane was 0.6±0.07V, whereas the threshold voltage for a TiN film in which both the (111) plane and the (110) plane coexist was 0.5±0.15V. It has therefore become clear that the threshold voltage varies more greatly.

That is, I have confirmed that, even with the use of the TiN/W gate electrode, there arises the problem of variations in threshold voltage, and this is due to TiN's work function, as with pure metal, having the crystal orientation dependence.

Also, I have confirmed that the grain size of TiN is in the range of 30 to 50 nm, and the number of crystal grains in the direction of gate length is only three to five for 0.15 $\mu$m of gate length and only two or three for 0.1 $\mu$m of gate length.

Although metal gate electrodes are considered to be promising for gate electrodes of MOS transistors used in memory and logic LSI circuits, we have found the problem that, as described previously, variations occur in threshold voltage of MOS transistors because the metal gate electrodes have the property that the work function of a metal as their material varies with crystal orientations.

Hereinafter, a MOS transistor having a metal gate electrode that can solve such a problem will be described.

First Embodiment

Referring now to FIG. 1 there is illustrated, in a cross-sectional view, a MOS transistor having a metal electrode according to a first embodiment of the present invention.

In this figure, 1 denotes a silicon substrate, on which a gate insulating film 2 is deposited. On the gate insulating film 2 is formed a metal gate electrode 3 that is made of a microcrystalline metal film in which the average grain size is 30 nm or less, and preferably 10 nm or less.

Here, it is not necessarily required that the grain size should be 30 nm or less throughout the metal gate electrode 3. The grain size is required to be 30 nm or less at least in a portion that contacts the gate insulating film 2. In addition, different grain sizes may be mixed as long as the 30 nm or less requirement is satisfied.

In order to form the metal gate electrode 3 made of such a microcrystalline metal film, it is recommended to use, for example, WNx, MoNx, TaNx (x<0.3), TiCxNy (0.05<x<0.5, 0.05<y<0.5), TiSixNy (0.05<x<0.5, 0.05<y<0.5), TaSixNy (0.05<x<0.05, 0.05<y<0.5), or MoSixNy (0.05<x<0.05, 0.05<y<0.5). To form the film, it is recommended to use CVD techniques.

A pair of source/drain regions 4 are formed in the surface region of the silicon substrate 1 so that the channel region therebetween is located just below the gate electrode 3. Reference numeral 5 denotes an interlayer dielectric.

Our studies revealed that, with the use of a metal gate electrode made of a microcrystalline metal film in which the grain size is 30 nm or less, variations in threshold voltage can be controlled to a satisfactory level.

Figure 2:
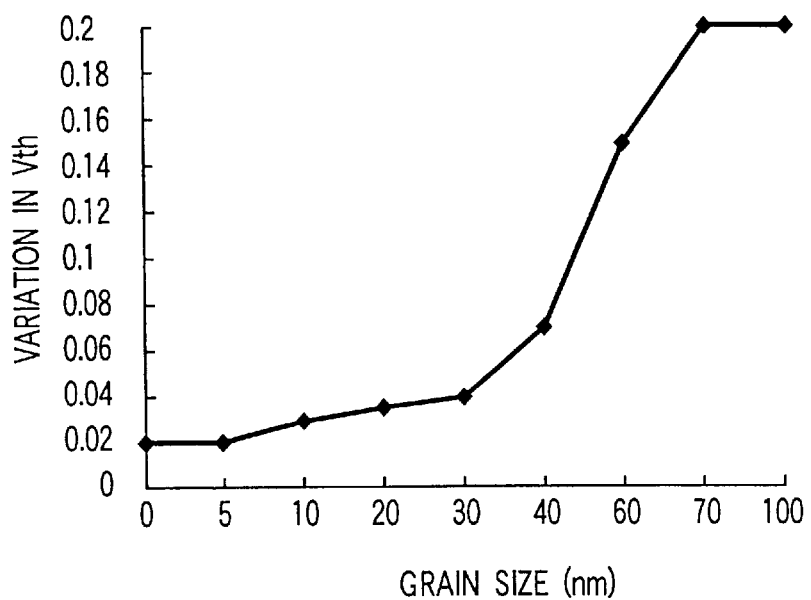
FIG. 2 is a plot of threshold voltages of MOS transistors against grain size.

FIG. 2 shows variations in threshold voltage (Vth) when a single film of TiN, WNx, TaNx, WSi$_{0.6}$N, TiSi$_{0.6}$N, or TaSi$_{0.6}$N or a stacked film of the above films in its portion that contacts the gate insulating film is used as the metal gate electrode 3. In either case, variations in threshold voltage are satisfactorily reduced to 40 mV or less when the grain size is 30 nm or less.

With MOS transistors of the 0.15 $\mu$m generation and later, it is required to control variations in threshold voltage to 40 mV or less. That is, the results shown in FIG. 2 means that the MOS transistor of this embodiment is useful as MOS transistors of the 1GDRAM generation and later.

Figure 14:
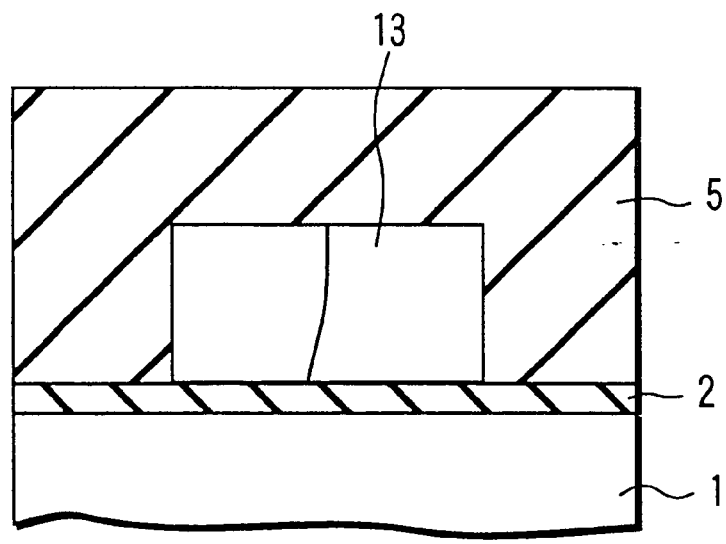
FIG. 14 is a cross-sectional view of a MOS transistor using a conventional metal gate electrode.

Thus, according to the present embodiment, a MOS transistor can be implemented which, even if its dimensions are scaled down, allows variations in threshold voltage among devices to be controlled to a satisfactory level through the use of a metal gate electrode made of a microcrystalline metal film in which the grain size is 30 nm or less. FIG. 14 shows, in sectional view, a conventional MOS transistor. In this figure, 13 denotes a metal gate electrode in which the grain size is larger than 30 nm.

In addition, by using a metal gate electrode made of a microcrystalline metal film in which the grain size is 30 nm or less, the stress in the metal gate electrode (the stress in the microcrystalline metal film) is reduced to 50 Mpa or less and the hot electron resistivity can be improved, thus providing improved reliability.

Although, in this embodiment, the channel type of the MOS transistor has not been particularly mentioned, the present invention may be applied to either transistor type (p-channel or n-channel). This is also the case with the other embodiments of the present invention.

Second Embodiment

Figure 3:
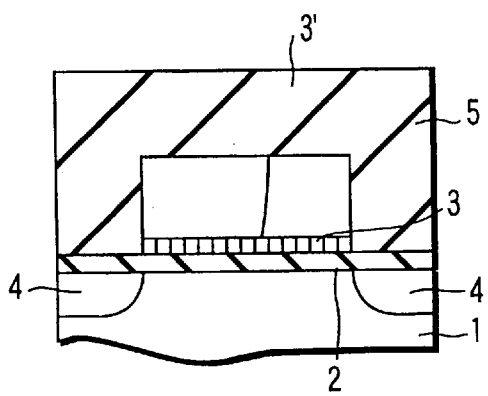
FIG. 3 is a cross-sectional view of a MOS transistor using a metal gate electrode according to a second embodiment of the present invention.

FIG. 3 is a cross-sectional view of a MOS transistor having a metal gate electrode according to a second embodiment of the present invention. In this figure, like reference numerals are used to denote corresponding parts to those in FIG. 1 and their detailed descriptions are omitted. The same applies to drawings for the other embodiments.

The second embodiment is distinct from the first embodiment in that a multilayered metal gate electrode is used, which comprises a metal gate electrode 3 (first gate electrode) that is formed on the gate insulating film 2 and made of a microcrystalline metal film in which the average grain size is 30 nm or less and a metal gate electrode 3' (second gate electrode) which is formed on the first gate electrode and has a grain size of more than 30 nm.

Our studies have confirmed that, even if the entire metal gate is not made of a microcrystalline metal film in which the grain size is 30 nm or less, variations in threshold voltage (variations in threshold voltage among devices) can be reduced to a satisfactory level if that portion of the metal gate electrode which contacts the gate insulating film is formed of a microcrystalline metal film in which the grain size is 30 nm or less. Therefore, the second embodiment provides the same advantages as the first embodiment.

In the second embodiment, the second gate electrode 3' is made of a material in which the grain size is more than 30 nm; however, this is not restrictive. The second gate electrode may be 30 nm or less in grain size provided that it is larger than the first gate electrode in grain size.

Third Embodiment

Figure 4:
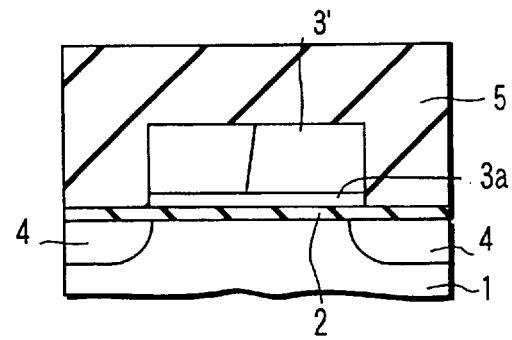
FIG. 4 is a cross-sectional view of a MOS transistor using a metal gate electrode according to a third embodiment of the present invention.

FIG. 4 is a cross-sectional view of a MOS transistor having a metal gate electrode according to a third embodiment of the present invention.

In the third embodiment, the metal gate electrode 3 in the second embodiment is replaced with a metal gate electrode 3a made of an amorphous metal film (namely, the grain size is 0 nm). The materials of the metal gate electrode 3a may be the same as those of the metal gate electrode 3. In this embodiment as well, the same advantages as the first embodiment can be obtained.

As an alternative to the metal gate electrode 3a, use may be made of a metal gate electrode made of a microcrystalline metal film, such as a TiN film, Ru film, or $RuO_2$ film, in which the grain size is 30 nm or less ($\neq 0$ nm).

Fourth Embodiment

FIG. 5 is a cross-sectional view of a MOS transistor having a metal gate electrode according to a fourth embodiment of the present invention.

In the fourth embodiment, the metal gate electrode 3 in the first embodiment is replaced with a metal gate electrode 3a made of an amorphous metal film. In this embodiment as well, the same advantages as the first embodiment can be provided.

As in the third embodiment, as an alternative to the metal gate electrode 3a, use may be made of a metal gate electrode made of a microcrystalline metal film, such as a TiN film, Ru film, or $RuO_2$ film, in which the grain size is 30 nm or less.

Fifth Embodiment

FIG. 6 is a cross-sectional view of a MOS transistor having a metal gate electrode according to a fifth embodiment of the present invention.

The fourth embodiment differs mainly from the first embodiment in that, instead of the metal gate electrode 3, a metal gate electrode 3b is used which is made of an amorphous metal film having two different crystal orientations and an average grain size of 30 nm or less. When the grain size is 0 nm, the metal film is an amorphous one.

To form such a metal gate electrode 3b, the gate insulating film is formed from two films $2_1$ and $2_2$ formed in separate steps and the interlayer dielectric is formed from two films $5_1$ and $5_2$ formed in separate steps. In this embodiment as well, the same advantages as the first embodiment can be provided. Note that the metal gate electrode 3b may have three or more crystal orientations.

FIGS. 7A through 7D are cross-sectional views, in the order of steps of manufacture, of the MOS transistor of the fifth embodiment.

First, as shown in FIG. 7A, a gate insulating film 21 is deposited on the surface of silicon substrate 1 at a thickness of 10 nm or less by means of thermal oxidation, thermal nitridation, or CVD. The gate insulating film $2_1$ is a dummy one that actually does not play the role of the gate insulating film.

Next, as shown in FIG. 7A, a dummy gate electrode pattern 6 having a thickness of the order of 50 to 200 nm is formed on the gate insulating film $2_1$ using photolithographic or RIE techniques.

As the dummy gate electrode pattern 6 use may be made of a hydrogen-containing silicon oxide film (the rate of etching by buffered hydrofluoric acid is about 100 times higher than that for silicon oxide formed by thermal oxidation), a silicon oxide film formed by thermal oxidation, a silicon nitride film formed by thermal nitridation, an amorphous silicon film, or a polysilicon film.

By using as the dummy gate electrode pattern 6 a silicon-based semiconductor film or insulating film, the roughness of sidewalls of the pattern caused by RIE can be reduced. Thereby, the dummy gate electrode pattern 6 can be formed with little variation in gate length. Specifically, the gate length will have a variation of ±10 nm about a designed value.

Next, as shown in FIG. 7A, impurities are ion implanted using the dummy gate electrode pattern 6 as a mask and then annealing is performed to form source/drain regions 4 having a depth of 50 nm or less.

Here, source/drain regions having the LDD (lightly doped drain) structure may be formed by performing ion implantation once before and after a gate sidewall insulating film of 50 nm or less in thickness is formed on the sidewall of the dummy gate electrode pattern 6.

Such a gate sidewall insulating film can be formed by first depositing an insulating film on the entire surface and then etching the insulating film by means of RIE so that the gate insulating film is left on the sidewall. The insulating film is formed of a material that has a lower rate of etching by RIE than the dummy gate electrode pattern 6. As an example, if silicon oxide is used for the dummy gate electrode pattern 6, silicon nitride or an insulating material, such as SiOxNy, is used for the insulating film.

Next, as shown in FIG. 7B, a silicon oxide film is formed on the entire surface by means of CVD so as to cover the dummy gate electrode pattern 6 and then polished by means of chemical/mechanical polishing (CMP) or mechanical polishing (MP) until the dummy gate electrode pattern is exposed, whereby an interlayer insulating film $5_1$ is formed.

The interlayer insulating film 51 may be formed of a stacked film in which a phosphorous. (P)-containing silicon oxide film is stacked on a silicon oxide film.

Next, as shown in FIG. 7C, the dummy gate electrode pattern 6 and the underlying gate insulating film 21 are removed using wet etching techniques, thereby forming an opening 7.

At this point, since the variation in the dimension of the dummy gate electrode pattern in the direction of gate length is small, the variation in the dimension of the opening in the direction of gate length is also small.

Next, as shown in FIG. 7D, an oxidation step is carried out to oxidize the exposed surface of the substrate at the bottom of the opening to form a gate insulating film $2_2$. To form a metal gate electrode, a microcrystalline metal film 3b in which the grain size is 30 nm or less is then formed by means of CVD so that the opening is filled with it.

At this point, the microcrystalline metal film grown from the substrate surface and the microcrystalline metal film grown from the insulating film (the gate insulating film 22 and the interlayer insulating film 51) have different crystal orientations. Thus, the microcrystalline metal film 3b which has two different crystal orientations and in which the grain size is 30 nm or less is formed inside the opening 7.

Finally, the metal film on the interlayer insulating film 51 is removed using CMP or MP to thereby form the metal gate electrode 3b in the opening 7. After that, an interlayer insulating film 52 is deposited to thereby complete the structure shown in FIG. 6.

Thus, by using CMP or MP, the top surface of the metal gate electrode 3b becomes smoothed and variations in the direction of height can be reduced. In addition, since the dummy gate electrode pattern and the opening has a small variation in their dimension in the direction of gate length, the metal gate electrode is also small in variation in its dimension in the direction of gate length.

Sixth Embodiment

FIG. 8 is a cross-sectional view of a MOS transistor having a metal gate electrode according to a sixth embodiment of the present invention.

In this embodiment, as shown in FIG. 8, an inner portion of the metal gate electrode in the fifth embodiment is replaced with a metal gate electrode 3' made of a metal film in which the grain size is great and the resistivity is lower (for example, an Mo film, W film, Ru film or Al film). For example, the metal gate electrode 3b is made of a film of TiN, the metal gate 3' is made of a film of W, and the gate insulating films $2_1$ and $2_2$ are each a film of $SiO_2$. In this embodiment as well, the same advantages as the first embodiment can be provided.

To fabricate such a MOS transistor, in the step of FIG. 7D, the microcrystalline metal film, serving as the metal gate electrode 3b later, is first deposited on the entire surface so that the bottom and sidewall of the opening 7 is coated with that metal film, but the inner portion of the opening is not filled with that metal film. A metal film, serving as the metal gate electrode 3' later, is then deposited on the entire surface so that the inner portion of the opening is filled with that metal film. After that, the microcrytalline metal film and the metal film outside the opening are removed by means of CMP and then an interlayer insulating film $5_2$ is formed.

Seventh Embodiment

FIG. 9 is a cross-sectional view of a MOS transistor having a metal gate electrode according to a seventh embodiment of the present invention.

In this embodiment, instead of forming the gate insulating film $2_2$ by means of oxidation as in the fifth embodiment, the film is formed by means of deposition techniques such as CVD. As a result, the film is also formed on the sidewall of the opening in the interlayer insulating film $5_1$. For example, the metal gate electrode 3b is made of a film of $Ta_2O_5$, the metal gate 3' is made of a film of Al, and the gate insulating films $2_1$ and $2_2$ are each a film of $SiO_2$. In this embodiment as well, the same advantages as the fifth embodiment can be provided.

In FIGS. 10A, 10B and 10C, there are illustrated cross-sectional views, in the order of steps of manufacture, of a MOS transistor according to the seventh embodiment.

First, as shown in FIG. 10A, subsequent to the step of FIG. 7C in the fifth embodiment, a gate insulating film $2_1$ is deposited at a thickness of 10 nm or less on the entire surface by means of CVD so as to cover the bottom and sidewall of the opening 7. As the gate insulating film $2_2$ use may be made of, for example, a SiOxNy film, a $Ta_2O_5$ film, a BST film, or a PZT film.

Next, as shown in FIG. 10B, a microcrystalline metal film 3b, serving as a metal gate electrode later, is deposited at a thickness of 10 nm or less on the entire surface by means of CVD. The film 3b is 30 nm or less in grain size and has two different crystal orientations. After that, a metal film 3', serving as a metal gate electrode later, is formed on the entire surface. The metal film 3' is larger in grain size and lower in resistivity than the metal film 3b. As the metal film 3' use may be made of, for example, a film of Mo, a film of W, a film of Ru, or a film of Al.

When the metal film 3b has a grain size of 0 nm, namely, when it is amorphous, it can be formed using sputtering.

Next, as shown in FIG. 10C, the metal film 3', the microcrystalline metal film 3b and the insulating film $2_1$ outside the opening 7 are removed and the surface is smoothed by means of CMP or MP, whereby the metal gate electrodes 3b and 3' are formed.

Finally, an interlayer insulating film $5_2$ is formed to thereby complete the MOS transistor structure shown in FIG. 9.

Eighth Embodiment

FIG. 11 is a cross-sectional view of a MOS transistor having a metal gate electrode according to an eighth embodiment of the present invention.

In this embodiment, like the fifth embodiment (FIG. 6), the metal gate electrode 3b is formed throughout the opening 7 when it is formed in the seventh embodiment (FIG. 9) in which it is formed at the bottom and on the sidewall of the opening. In this embodiment as well, the same advantages as the seventh embodiment are provided.

We have confirmed that the MOS transistors according to the eighth embodiment have a variation in threshold voltage of ±0.02V about a setting of 0.55V when the gate length is 0.15 nm, which is less than one-seventh of the conventional value.

In the embodiments described so far, the processes subsequent to the formation of the metal gate electrode (the thermal process, such as annealing, and the process of depositing the interlayer insulating film and the like) should be performed at low temperatures of 750° C. or preferably below 600° C. or more preferably 400° C. or below.

The reason is that, when the process temperatures after the formation of the metal gate electrode were set to 750° C. or below, degradations of characteristics of the MOS transistors, such as an increase in gate leak current, an increase in variation in threshold voltage, etc., were not observed.

It is to be noted that the process temperature is preferably about 300° C., the reason being that there occurs an inconvenience such as an increase in source/drain resistance.

On the other hand, when a process at a temperature of 800° C. or above was added after the formation of the metal gate electrode, the gate leak current increased by one order of magnitude and the threshold voltage increased by 0.1V or more with increasing grain size.

In order to allow the process temperatures after the formation of the metal gate electrode to be 750° C. or below, it is required to carry out the ion implantation step and the annealing step for forming the source/drain regions, which involve a higher temperature than 750° C., prior to the formation of the gate insulating film and the metal gate electrode.

To this end, as described in connection with the fifth embodiment, it is recommended to, after the formation of the dummy gate electrode pattern and then the source/drain regions, remove the dummy gate electrode pattern and then form the gate insulating film and the metal gate electrode.

From the viewpoint that the process temperatures after the formation of the metal gate electrode should be kept at 750° C. or below, in the first and second embodiments as well, it is desirable to, in accordance with the method of the fifth embodiment, form the source/drain regions using the dummy gate electrode pattern as a mask for ion implantation before forming the gate insulating film and the metal gate electrode.

Thus, the formation of the source/drain regions prior to the formation of the gate insulating film and the metal gate electrode allows the subsequent processes to be carried out at low temperatures as low as 450° C. As a result, as the gate insulating film, a high-permittivity insulating film, such as a $Ta_2O_3$ film, a BST film, or a PZT film, can be used.

The reason is that: After the formation of a high-permittivity insulating film, annealing is carried out to obtain a desired permittivity. When source/drain regions are formed after the high-permittivity insulating film has been formed, the permittivity will be deviated from a set value by the high-temperature processing at the time of the formation of the source/drain regions.

Ninth Embodiment

FIGS. 12A through 12H are cross-sectional views, in the order of steps of manufacture, of a MOS transistor of a ninth embodiment of the present invention.

Figure 12A:
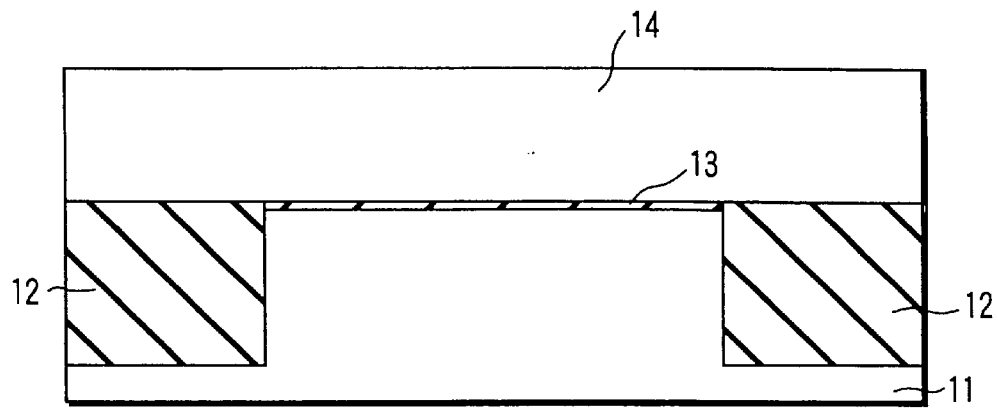

First, as shown in FIG. 12A, device isolation trenches are formed into a silicon substrate 11 through dry etching and then an insulating film consisting of an insulating material, such as SiNO, that is close in thermal expansion coefficient to silicon oxide or silicon (about 3 ppm/K) is formed through deposition or coating. After that, the excessive insulating film outside the isolation trenches are removed by means of CMP or MP, whereby a buried isolation insulating film 11 is formed within the trenches.

The device isolation may be performed in accordance with the following method.

First, a thermal oxide film, serving as the device isolation insulating film 12 later, is formed on the surface of the silicon substrate 11. Then, the insulating film is selectively removed in areas that correspond to device forming regions in the substrate by means of lithography and wet etching or dry etching. As a result, the areas of the surface of the substrate 11 that correspond to the device forming regions are exposed.

Next, a silicon film is epitaxially grown on the exposed surface of the silicon substrate. The epitaxial growth is continued until the silicon film sticks up above the thermal oxide film. As a result, the openings resulting from the selective removal of the thermal oxide film are fully plugged.

A material gas for the epitaxial growth is an $SiH_4$ gas, an $Si_2H_6$ gas, a mixed gas of $Si_3H_8$ and HCl, or an $SiH_2Cl_2$ gas. The temperature should preferably be within the range of 700 to 1100° C.

Next, the excessive silicon film outside the openings is removed and the entire surface is smoothed by means of CMP or MP. After that, to improve the crystalline property of the surface of the silicon film, the silicon film is heated in a hydrogen atmosphere at a temperature of 800° C. or above, and preferably at a temperature of 900° C. or above. By such a heat treatment, Si atoms are allowed to migrate at the surface of the silicon film, thus smoothing the surface of the silicon film at the atomic level.

The above-described isolation approach allows the device forming regions to be isolated from each other with an isolation width of 0.15 $\mu$m or less. Instead of growing the silicon film, a silicon-germanium film or a germanium film may be epitaxially grown.

Next, as shown in FIG. 12A, a gate insulating film 13 is formed by thermal oxidation over the device forming region at a thickness of the order of 3 to 10 nm and then a multilayered film 14 of a silicon nitride film and an amorphous silicon film (SiN/a—Si film), serving as a dummy gate electrode pattern later, is formed on the gate insulating film 13. The gate insulating film 13 is a dummy gate oxide film that actually does not serve as a gate oxide film.

The top layer of the multilayered film is not restricted to a film of silicon nitride. The top layer has a requirement that, in the postprocess (FIG. 12G) in which an interlayer insulating film 18 is polished to smooth the surface, it should be lower in polishing rate than that interlayer insulating film. Thus, any other insulating film that satisfies such a requirement can be used.

Also, the bottom layer is not restricted to a film of amorphous silicon. Any other film can be used provided it has a higher etch rate than the gate oxide film 13. Specifically, since the gate oxide film 13 is formed by thermal oxidation, a silicon-based film, such as a polysilicon film, may be used.

Figure 12B:
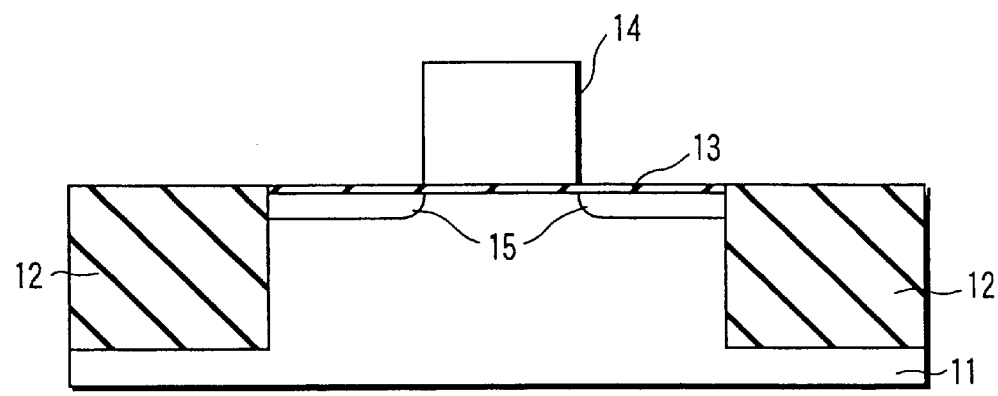

Next, as shown in FIG. 12B, the SiN/a—Si film 14 is processed by means of anisotropic etching techniques, such as RIE, so that the same pattern as the gate electrode forms. After that, impurities are introduced into the substrate surface using the processed SiN/a—Si film (dummy gate electrode pattern) 14 as a mask and then the impurities are electrically activated, thereby forming shallow diffusion layers (LDD) 15.

The impurities are introduced by means of ion implantation, plasma doping or vapor phase diffusion. The electrical activation of the impurities is carried out by means of rapid thermal annealing (RTA) at a rate of 100° C./sec, at temperatures of 800 to 900° C. for 30 seconds less.

Figure 12C:
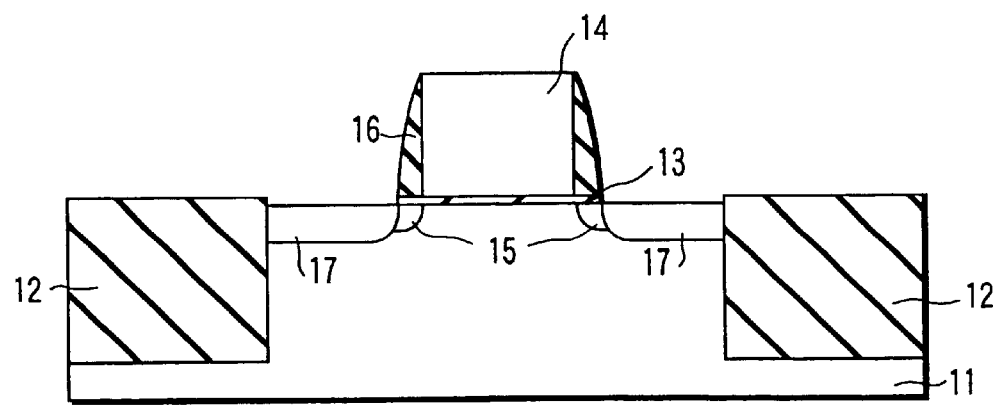

Next, as shown in FIG. 12C, a gate sidewall insulating film 16 consisting of silicon nitride or silicon nitride oxide is formed at a thickness of 5 to 30 nm by means of standard techniques. By the etching process involved in forming the gate sidewall insulating film 16, the SiN/a—Si film 14 underlying the gate sidewall insulating film 15 remains unetched, but in other areas it is removed.

It is desirable that an oxide film of 10 nm or less in thickness should be formed in advance between the gate sidewall insulating film 16 and the SiN/a—Si film 14 so that the sidewall insulating film will not shrink laterally during the postprocess of removing the SiN/a—Si film 14.

Next, as shown in FIG. 12C, impurities are introduced into the substrate surface using the gate sidewall insulating film 15 and the SiN/a—Si film 14 as a mask, thereby forming source/drain diffusion layers 17.

The impurities are introduced by means of ion implantation, plasma doping or vapor phase diffusion. The electrical activation of the impurities is carried out by means of rapid thermal annealing (RTA) at a rate of 100° C./sec, at temperatures of 800 to 900° C. for 30 seconds or less. In order to enhance the concentration of impurities to be activated, a thermal process may be carried out for one sec or less at 1000° C. or above using electron beams, a laser having wavelengths in the ultraviolet region, a mercury lamp, or a xenon lamp.

Although the embodiment has been described as activating the impurities in the source/drain diffusion layers 17 and the impurities in the shallow diffusion layers 15 in separate steps, the impurities in the layers 15 may be activated simultaneously with the activation of the impurities in the layers 17.

Figure 12D:
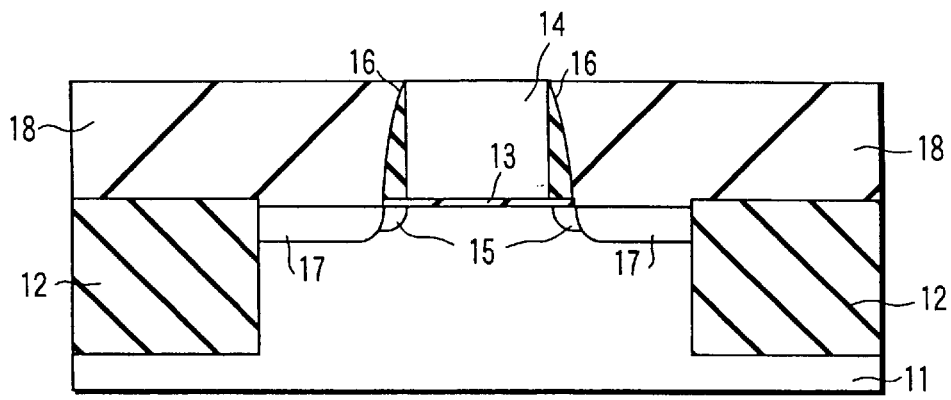
Figure 12E:
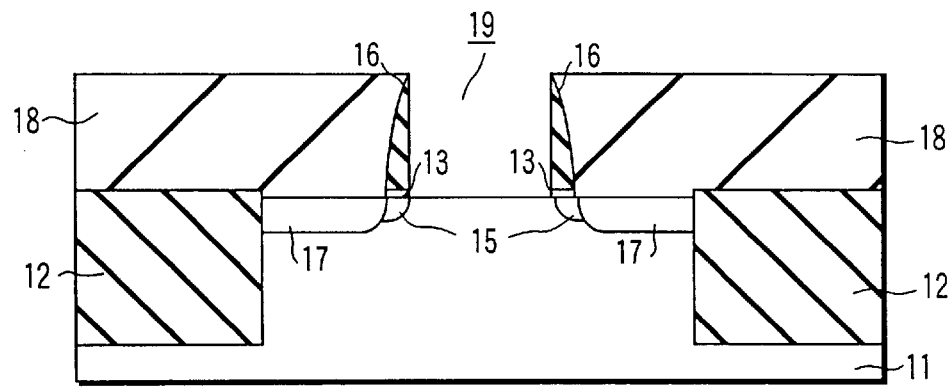

Next, as shown in FIG. 12D, an interlayer insulating film 18 is deposited on the entire surface by means of CVD and then polished by means of CMP to smooth the surface until the surface of the SiN/a—Si film is exposed.

Figure 12F:
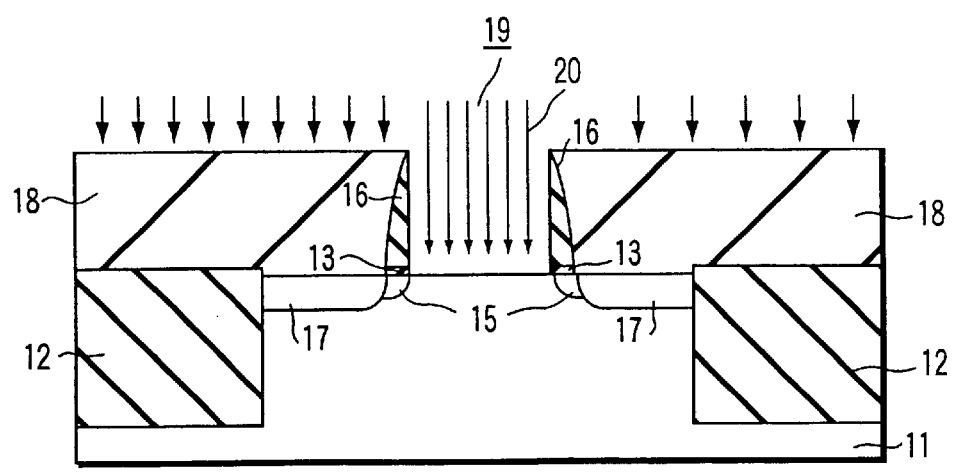

Next, as shown in FIG. 12F, the SiN film in the SiN/a—Si film 14 is removed first using anisotropic etching techniques, the a—Si film in the SiN/a—Si film is removed next using isotropic etching techniques, and finally, the underlying oxide film 16 is etched away using standard etching techniques, thereby forming an opening 19. In removing the oxide film 13, care must be taken not to produce crystal defects in the silicon substrate 11.

Next, as shown in FIG. 12F, to adjust the threshold voltage, impurity ions 20 are implanted into the substrate surface through the opening 19 and then electrically activated by a thermal process. Examples of impurity ions include In ions, P ions, As ions, and Sb ions. Which ion are used depends on the channel type or the threshold voltage value.

The implantation of the impurity ions 20 while cooling the silicon substrate 11 so that the substrate temperature reaches −60° C. or below and preferably −100° C. or below allows the control of aggregation of atomic vacancies. The control of aggregation of atomic vacancies allows a thermal process to provide complete recovery from crystal defects. For this reason, it is desirable to perform the implantation of impurity ions while cooling the silicon substrate.

Moreover, it is desirable to implant the impurity ions 20 into the substrate surface vertically with respect to the substrate surface or in a nearly vertical direction five degrees or less away from the normal to the substrate surface.

Furthermore, it is desirable to start the thermal process for activating the impurity ions in a thermal processing chamber under conditions in which oxidizing agents, such as oxygen, vapor, carbon dioxide and so on, are not being introduced into the chamber by evacuating it or filling it fully with an inert gas such as nitrogen, argon, or the like. In this case, it is preferable that the thermal processing temperature be 800 to 1000° C. and the processing time be one minute or less.

After that, a very thin film of oxide (not shown) of 1 nm or less in thickness is formed on the substrate surface at the bottom of the opening 19 through wet oxidation using an aqueous solution containing hydrogen peroxide water and ozone water or dry oxidation using oxygen radicals or ozone.

Next, as shown in FIG. 12G, a gate insulating film 21, such as a $Ta_2O_5$ film, $TiO_2$ film, BSTO film, $CeO_2$ film or, YSZ film (Yttrium Stabilied Zirconia) that is higher in permittivity than silicon oxide is formed.

For the formation of the gate insulating film 21 using CVD, it is recommended to form it by removing natural oxide present in the area where that film is to be formed, absorbing oxygen on that area by a layer of one or two atoms or forming Si—O bonds in that area, and then setting the sample in the CVD furnace. This approach can form the gate insulating film with uniformity.

As the gate insulating film 21, use may be made of an SiOxNy film of a thickness of 2 to 3 nm or a film of nitride formed through nitridation using nitrogen radicals as nitriding species.

Next, as shown in FIG. 12G, a conductive film 22, serving as the first gate electrode, of 10 nm or less in thickness is formed, which is made of a material having metallic conductivity, such as TiN, and determines the work function of the gate.

When a TiN film is used as the conductive film 22, the processing conditions, such as the TiN composition, the processing temperature, the pressure, etc., are set up so that the TiN grain size is 30 nm or less. Specifically, the TiN film is formed by either a method of sputtering by which, with the film formation temperature set at 300° C. or below, the ratio of pressure between Ar and nitrogen is controlled so that the nitrogen density becomes higher than with the Ti-to-N ratio of one to one or a method of sputtering by which oxygen is added in quantities of 30% or less.

The lower limit of the film formation temperature is a temperature at which a sputter gas is condensed. In the embodiment of the present invention there arises no problem if the temperature exceed room temperature (25° C.).

The addition of oxygen allows the grain size to be reduced to 10 nm or less. Setting the oxygen density higher than 30% results in reduced electrical conductivity of TiN, and the resulting TiN film will no longer exhibit metallic conductivity. In order to control an increase in the electrical conductivity of TiN, it is preferable to set the oxygen density to within the range of 1 to 10%.

The grain size can also be reduced by adding C or B into TiN instead of oxygen. The density of C or B is 30% or less, and preferably 10% or less. Materials of C include organic-substance gases, such as methane, and organic-compound gases such as dimethylaminomethane, diethylaminomethane, etc. Materials of B include gases, such as diborane and BF3, and sputter targets containing these substances. In the case of forming amorphous TiN by adding C into TiN, it is possible to set the work function of TiN to 4.5 eV or less by controlling the composition of TiN.

In addition, the TiN film may be formed by CVD using a mixed gas of $TiCl_4$ and $NH_3$ as a material gas at a temperature of 600° C. or below so that the nitrogen content will become higher than with the Ti-to-Ni ratio of one to one (i.e., the TiN film is rich in nitrogen). At temperatures above 600° C., irregularities of the TiN film surface become considerably large, which makes it impossible to form a low-resistivity metal film, serving as the second gate electrode, on the TiN film with uniformity. The lower limit of the temperature is a temperature at which the material gas is dissolved.

When the resistivity of the gate electrode is allowed to be 500 $\mu\Omega$·cm or more, the gate electrode may be formed of a TiN film in its entirety. In this case, it will be required to form a TiN film of 50 nm or less in thickness. To this end, it is only required to form a TiN film which is a columnar or needle crystal and has orientation or an amorphous TiN film.

Materials other than TiN include metal nitrides, such as Ta nitride, Nb nitride, Zr nitride, Hf nitride, and so on, metal carbides, metal borides, metal-Si nitrides, metal-Si carbides, and metal-carbon nitrides.

When using the conductive film 22 made of such a material as the first gate electrode, it is desirable to add oxygen into the film within a range that the conductivity is not reduced by 50% or more in order to ensure thermal stability between the conductive film 22 and the gate insulating film 21.

The interface of the conductive film 22 made of that type of material and the gate insulating film 21 consisting of a material, such as Ta oxide, Ti oxide, Zr oxide, Hf oxide, or Ce oxide, has excellent thermal stability.

Next, as shown in FIG. 12G, a conductive film 23 serving as the second gate electrode is formed on the entire surface. Specifically, an Al film, as the conductive film 23, is deposited on the entire surface by means of sputtering and a reflow process is then carried out to allow the Al film to reflow, thereby filling in the opening 19. Alternatively, a low-resistivity metal film serving as the conductive film 23, such as a W film, may be deposited on the entire surface so as to fill in the opening.

Finally, as shown in FIG. 12H, the excessive conductive films 22 and 23 outside the opening are removed and the surface is smoothed by means of CMP or MP, thereby completing the MOS transistor having the gate insulating film 21, the first gate electrode 22, and the second gate electrode 23 buried in the opening 19.

If there is a need of making the source/drain regions low in resistivity, it is recommended to form a metal silicide layer, such as a $CoSi_2$ layer or a $TiSi_2$ layer, on the surface of each of the source/drain diffusion layers 17 in a step between the process of FIG. 12C and the process of FIG. 12D.

Here, if the depth of the source/drain diffusion layers 17 is 100 nm or less, it is better to keep the source/drain diffusion layers 17 in the areas subjected to corrosion by the metal silicide layer 50 nm or more away from the pn junction by, for example, epitaxially growing a semiconductor layer of Si, Si—Ge or Si—Ge—C on the source/drain diffusion layers.

A C-containing semiconductor layer, such as the Si—Ge—C layer, has a larger band gap than a semiconductor layer, such as the Si—Ge layer, that contains no C. Thus, in the C-containing semiconductor layer, recombination is difficult to take place. As a result, the characteristics of the junction of the source/drain diffusion layers 17 and the semiconductor layer are improved.

The present invention is not restricted to the embodiments described so far. For example, although the embodiments have been described in terms of a single MOS transistor, the present invention is also applicable to memory LSI circuits, such as DRAMs, that have MOS transistors, logic LSI circuits, and LSI circuits having a memory LSI circuit and a logic LSI circuit built in.

In addition, the present invention can be applied to semiconductor devices having MOS devices of another type, such as MOS capacitors. When applied to the MOS capacitors, the present invention can control variations in capacitance (variations in capacitance among MOS capacitors), so that a given amount of charge corresponding to an operating voltage can be stored.

Figure 13:
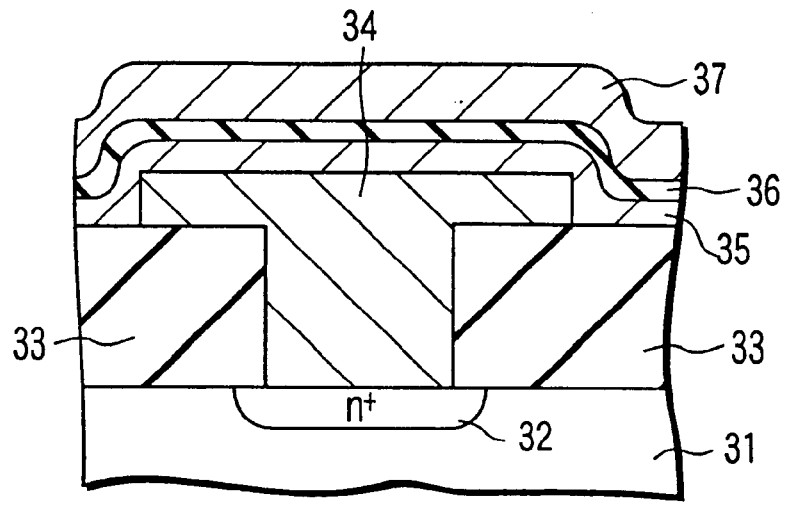
FIG. 13 is a cross-sectional view of a stacked capacitor of the present invention.

FIG. 13 is a cross-sectional view of a stacked capacitor using the principles of the present invention. In this figure, 31 denotes a silicon substrate having an n-type doped region 32 formed in its surface. This region is, for example, an n-type source/drain region of an n-channel MOS transistor.

An interlayer insulating film 33 is formed on the silicon substrate. A buried plug electrode 34 is in contact with the n-type doped region 32 through a contact hole formed in the interlayer insulating film. The plug electrode consists of a polysilicon film, a TiN film, or a stacked W/TiN/TiS$_2$ film.

On the buried plug 34 are formed sequentially a lower capacitor electrode 35 consisting of a stacked Pt/Ti film, a capacitor insulating film 36 consisting of a perovskite oxide film such as Ta oxide film, a BaSrTi oxide film, or a BaTa oxide film, and an upper capacitor 37 consisting of a Pt film, Ir film, RU film, Pt oxide film, Ir oxide film, Ru oxide film, or SrRu oxide film.

Here, the average grain size in at least that portion of the lower capacitor electrode 35 which contacts the capacitor insulating film is set at 30 nm or less, and the average grain size in at least that portion of the upper capacitor electrode 37 which contacts the capacitor insulating film is set at 30 nm or less. When the grain size is 0 nm, the film is amorphous.

The present invention may be applied to both MOS transistors and MOS capacitors which construct memory cells in DRAMs.

The MOS device may be formed in a semiconductor layer on a silicon substrate, not in the silicon substrate. As the materials of the metal gate electrode and the gate insulating film, various materials described in "Brief Description of the Invention" of this specification can be used in addition to the materials described in connection with the embodiments. It is apparent that the present invention may be implemented in still other ways without departing the scope and spirit thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming an insulating film having an opening on the surface of a semiconductor substrate;

forming a MOS transistor on the substrate by forming a gate insulating film on the bottom and on the sidewall of the opening and by forming a gate electrode on the gate insulating film, wherein a metal-containing portion of the gate electrode contacts the gate insulating film on the bottom of the opening and the average grain size in that portion being 30 nm or less.

2. The method according to claim 1, wherein the gate electrode is made of a titanium nitride film in which ratio of nitrogen to titanium is greater than one.

3. The method according to claim 2, wherein the titanium nitride film is formed by means of sputtering at a temperature of 300° C. or below with the pressure ratio of a nitrogen gas to a sputter gas controlled.

4. The method according to claim 2, wherein the titanium nitride film is formed by means of sputtering in an atmosphere in which the oxygen concentration is 30% or less.

5. The method according to claim 2, wherein the titanium nitride film is formed by means of CVD at a temperature of 600° C. or below.

* * * * *

UNITED STATES PATENT AND TRADEMARK OFFICE
CERTIFICATE OF CORRECTION

PATENT NO. : 6,730,581 B1 Page 1 of 1
DATED : May 4, 2004
INVENTOR(S) : Suguro

It is certified that error appears in the above-identified patent and that said Letters Patent is hereby corrected as shown below:

<u>Title page,</u>
Item [30], Foreign Application Priority Data, insert:
-- Nov. 28, 1997 (JP) ............. 9-344437
   Nov. 19, 1998 (JP) ..............10-329698 --.

Signed and Sealed this

Sixth Day of July, 2004

JON W. DUDAS
*Acting Director of the United States Patent and Trademark Office*